(12) United States Patent
Magliocco et al.

(10) Patent No.: US 7,385,385 B2
(45) Date of Patent: Jun. 10, 2008

(54) SYSTEM FOR TESTING DUT AND TESTER FOR USE THEREWITH

(75) Inventors: Paul Magliocco, Los Gatos, CA (US); Ray Wakefield, Santa Clara, CA (US); Paul G. Trudeau, Mountain View, CA (US)

(73) Assignee: Nextest Systems Corporation, San Jose, CA (US)

( * ) Notice: Subject to any disclaimer, the term of this patent is extended or adjusted under 35 U.S.C. 154(b) by 17 days.

(21) Appl. No.: 10/170,916

(22) Filed: Jun. 12, 2002

(65) Prior Publication Data

US 2003/0062888 A1    Apr. 3, 2003

Related U.S. Application Data

(60) Provisional application No. 60/326,839, filed on Oct. 3, 2001, provisional application No. 60/369,419, filed on Apr. 1, 2002.

(51) Int. Cl.
*G01R 31/02* (2006.01)
(52) U.S. Cl. .................................... 324/158.1; 324/765
(58) Field of Classification Search ........ 324/754–765, 324/73.1, 158.1; 714/724–736; 702/117–121
See application file for complete search history.

(56) References Cited

U.S. PATENT DOCUMENTS

| | | | |
|---|---|---|---|
| 4,460,997 A * | 7/1984 | Harns .......................... 714/711 |
| 4,729,246 A | 3/1988 | Melgaard et al. |
| 5,053,698 A * | 10/1991 | Ueda .......................... 714/736 |
| 5,497,079 A * | 3/1996 | Yamada et al. .......... 324/158.1 |
| 5,550,466 A * | 8/1996 | Botka ....................... 324/158.1 |
| 5,650,732 A | 7/1997 | Sakai |
| 5,951,705 A * | 9/1999 | Arkin et al. ................. 714/738 |
| 5,952,842 A | 9/1999 | Fujimoto |
| 6,040,691 A * | 3/2000 | Hanners et al. .......... 324/158.1 |
| 6,157,200 A * | 12/2000 | Okayasu ..................... 324/753 |
| 6,449,741 B1 * | 9/2002 | Organ et al. ................. 714/724 |

* cited by examiner

*Primary Examiner*—Vinh P. Nguyen
(74) *Attorney, Agent, or Firm*—Dorsey & Whitney LLP

(57) ABSTRACT

A tester configured to stack with at least one other tester to provide a test system for simultaneously testing a number of devices in parallel on different testers, or testing a device having more pins than can be accommodated by a single tester. The tester includes a test site with a number of pin electronics channels, an interface for interfacing with the device, and a computer for interfacing with a host computer in the test system. The testers can be fastened directly to one another or to a common frame. Preferably, the interface enables a single device board to simultaneously engage interfaces on multiple testers. More preferably, the interface extends from a top surface of the tester to engage the device board. Vents in top and front surfaces of an enclosure enables movement of air to cool components of the tester without interference from testers on either side or a back of the enclosure.

40 Claims, 13 Drawing Sheets

SYSTEM FOR TESTING DUT AND TESTER FOR USE THEREWITH

CROSS REFERENCE TO RELATED APPLICATIONS

The present application claims priority from commonly assigned U.S. Provisional Patent Applications Ser. No. 60/326,839, filed Oct. 3, 2001, and Ser. No. 60/369,419, filed Apr. 1, 2002, which are incorporated herein by reference.

FIELD OF INVENTION

This invention pertains generally to test systems for testing devices under test (DUTs), and more particularly to test systems for testing semiconductor devices or integrated circuits (ICs).

BACKGROUND

Automated or automatic test systems are widely used by manufacturers in the electronics industry to test various devices, including electronic components and ICs, to cull defective devices before they are incorporated in products. Broadly, there are three types of digital devices that are commonly tested using automated test systems, those having memory arrays or circuits, such as flash memory or random access memories (RAM), those having logic circuits, such as micro controllers, application specific ICs (ASICs) and programmable logic devices (PLDs), and those having both memory circuits and logic circuits. Generally, it is desirable to test the devices at several points during the manufacturing process including while they are still part of a wafer or substrate, and after packaging the devices but before they are mounted or assembled on modules, cards or boards. This repetitive testing imposes demands on automated test systems to perform tests at high speed and with a high degree of accuracy. Moreover, the trend in the electronics industry has been to further increase the miniaturization of electronic devices and circuits, thereby allowing for an increase in the complexity of the devices. As the devices become more complex, the complexity of the test systems and their cost increase correspondingly.

Test systems have traditionally been packaged in fixed sized chassises with a defined maximum pin count for each chassis size. To expand to pin counts greater than the capacity of a given chassis, the traditional approach has been to use a new and bigger chassis incorporating bigger power supplies, more PC board slots, and a larger Device Under Test (DUT) interface apparatus. To realize pin counts smaller than the maximum available in a given (typically large) chassis, the traditional approach has been to depopulate the chassis by removing PC boards. The pin count of the tester is reduced in this way, but there is still a tremendous expense carried in the product in unused backplanes, power supplies, cabling, and mechanical structure not required for the small number of PC boards in a small pin count configuration.

The exact same arguments hold for the electronic section of the tester. Designing, debugging, and manufacturing different electronic hardware for different sized test systems is very expensive. The electronics in a tester is typically two to five times more expensive than the mechanical portion of a tester and the development costs scale accordingly. Thus, minimizing the number of circuit board types to design, manufacture, and support across a wide range of tester sizes has a huge impact on the tester manufacturer's expenses and inventory costs.

Another problem with conventional test systems having a fixed sized chassis arises from their size and weight. Because ICs are manufactured, packaged and tested in controlled fabrication facilities known as fabs, an important consideration in selecting equipment is the amount of floor space occupied by the equipment. This is often referred to as the equipment footprint. Thus, it is generally desirable that equipment used in the clean room, such as the test system, present as small a footprint as possible. It is also often desirable that equipment be capable of being quickly and easily relocated within the facility from a standby location to a testing area, or between multiple testing areas within the fab or even between multiple fabs, thereby saving on both floor space and investment in testing systems.

Yet another problem with the conventional approach of maintaining different test systems for testing of DUTs having different pin counts is the expense associated with training operators and maintenance technicians on each different test system or differently configured test system. Indeed, because the need for trained operators and maintenance technicians continues for the life of the test system, this expense can be more significant than that of maintaining spare parts for multiple test systems.

Accordingly, there is a need for a test system and method of operating the same that can be quickly and easily scaled to enable testing of a DUT having a number of pins greater than can be accommodated on any single tester, or to simultaneously test a large number of smaller DUTs in parallel on different testers. There is a further need for a test system that conserves floor space in a manufacturing facility by reducing or minimizing system footprint for test systems having larger capacity. There is still a further need for a test system that increases manufacturing efficiency by reducing the volume of spare parts and assembly documentation maintained per test system, and by reducing manufacturing and service training required per test system.

The system and method of the present invention provides these and other advantages over the prior art.

SUMMARY

The present invention provides a test system module or tester of a test system for testing semiconductor devices or DUTs (device under test) that can be quickly and easily coupled or stacked to simultaneously test a number of DUTs in parallel on different testers or to enable the testing of a DUT having a number of pins greater than can be accommodated on any single tester.

In one aspect, the present invention is directed to a tester adapted to be mechanically coupled side-by-side and back-to-back with at least two other substantially identical testers to provide a test system for testing a device under test (DUT). Generally, the tester includes a cooling system for cooling components of the tester, at least one test site having a pattern source, a plurality of pin electronics (PEs) channels, and a DUT interface for interfacing with the DUT. At least a portion of the back and side surfaces of the tester are substantially free of essential connectors that would impede mechanical coupling of the tester with other testers. The testers can be fastened directly to one another, or affixed to a common holding frame.

In one embodiment, the DUT interface interfaces with the DUT via a DUT board, and the DUT interface enables a single DUT board to simultaneously engage the DUT interface and another DUT interface on at least one other tester mechanically coupled thereto. In one version, the tester further includes a docking mechanism to lock or position the DUT board over a top surface of the tester. Preferably, the DUT interface is extendable from the top surface of the tester, and the tester further includes an extension mechanism to extend the DUT interface to engage the DUT interface board lock in position over the top surface of the tester. More preferably, the extension mechanism includes an interlock to prevent the DUT interface from extending to engage the DUT interface board if the DUT interface board is not properly positioned over the top surface of the tester.

In another embodiment, the tester includes an enclosure with first vents in a top surface and second vents in a front surface thereof, and internal components of the tester are cooled by movement of air through the vents without interference from other testers mechanically coupled to either side or the back of the enclosure. In one version, the tester includes a backplane with a number of daughter boards depending therefrom in the enclosure, and the backplane includes a number of openings therein to direct air over components on the daughter boards. Alternatively, the tester includes a number of daughter boards coupled to edge connectors in the enclosure, and air is directed between the edge connectors and over either side of the daughter boards to cool components thereon.

In yet another embodiment, the tester is adapted to mechanically and electrically couple with at least one other tester to provide a test system capable of testing of an IC having a number of pins greater than can be accommodated on any single tester. Generally, each tester has an enclosure with an electrical connector external thereto or accessible therethrough for electrically coupling the tester with at least one other tester.

In another aspect, the present invention is directed to a test system for testing DUTs including a host computer and a number of testers as described above. Generally, each tester has at least one test site with a number of PEs, a DUT interface for interfacing with the DUT, and optionally a test site controller for interfacing with the host computer. As described above, each of the testers are configured to be mechanically coupled with each other. Preferably, the test system includes a single software user interface on the host computer to control all test sites in the testers.

In one embodiment, the test system works with an automatic material handler to electrically couple a number of DUTs to the DUT interfaces on the testers, thereby enabling the DUTs to be tested simultaneously in parallel on different testers.

In another embodiment, the testers are electrically coupled and slaved together to enable the testing of DUTs having a number of pins at least greater than the PE channels on any one tester.

In yet another aspect, the invention is directed to a tester having an enclosure with first vents in a top surface and second vents in a front surface thereof, and a backplane located in the enclosure proximal to the first vents. The backplane has a number of daughter boards depending therefrom, and a number of openings in the backplane direct air flow over components on the daughter boards to cool the components. Optionally, the openings are adapted to direct air flow over preselected components requiring greater or focused cooling.

Alternatively, the tester does not include a backplane but only a number of edge connectors in the enclosure proximal to the first vents with daughter boards coupled thereto, and air flow is directed between the edge connectors and over either side of the daughter boards to cool components thereon. Optionally, the tester further includes ducts or baffles between the edge connectors to direct air flow over preselected components requiring greater or focused cooling.

BRIEF DESCRIPTION OF THE DRAWINGS

These and various other features and advantages of the present invention will be apparent upon reading of the following detailed description in conjunction with the accompanying drawings, where.

DETAILED DESCRIPTION

The present invention is directed to a test system having a system module or tester that can be quickly and easily mechanically coupled or stacked with at least one other tester to simultaneously test a number of DUTs (devices under test) in parallel on different testers, and electrically coupled to enable the testing of a DUT having a number of pins greater than can be accommodated on a single tester.

A test system for which a tester and method according to the present invention would be particularly useful will now be described with reference to FIG. 1. For purposes of clarity, many of the details of test systems that are widely known and are not relevant to the present invention have been omitted. Test systems are described in more detail in, for example, commonly assigned, co-pending U.S. patent applications Ser. No. 09/895,439, and Ser. No. 10/039,738, which are incorporated herein by reference.

Figure 1:
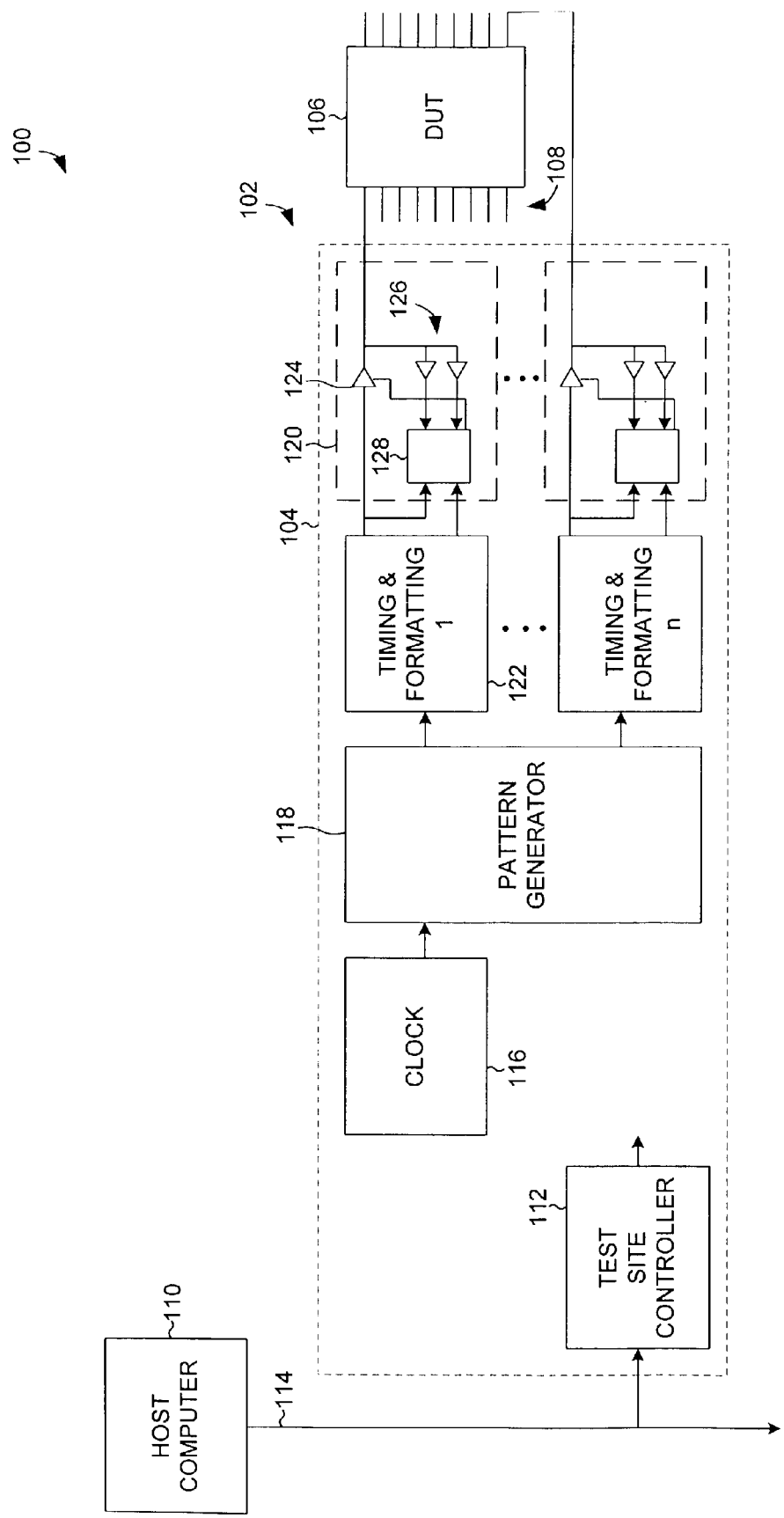
FIG. 1 is a simplified block diagram of a test system having a single test site for which a tester and method according to the present invention would be useful.

FIG. 1 is a simplified block diagram of a test system 100 having a single test system module or tester 102 with a single test site 104 for testing one or more DUTs 106. By DUT 106 it is meant any electronic component, module, or integrated circuit (IC) having logic circuits, memory arrays, analog circuits or any combination thereof. The DUT 106 can be a die, packaged or can be one of a number of devices on a substrate (not shown). The DUT 106 can be coupled to test system 100 via a number of pins 108 or via probes (not shown) or contacting pads (not shown) on the substrate.

Referring to FIG. 1, the test system 100 includes, in addition to the test site 104, a general purpose host computer 110 or PC. The host computer 110 performs housekeeping functions such as downloading test programs to a test site computer or test site controller 112 in the test site 104, receiving results of device tests, and aiding in linking multiple test sites within a single test system 100, or linking multiple test systems (not shown) within a facility. The host computer 110 can be connected via a network connection 114 to other testers (not shown in this figure) as described infra. The host computer 110 can also be connected via an ethernet connection to a separate Local Area Network or a facility wide enterprise network (not shown) to track operation of the test system 100 and/or results of device tests.

Generally, the test site 104 includes, in addition to the test site controller 112, a clock 116, one or more test signal or pattern sources, such as pattern generators 118, a number of pin electronic (PE) circuits or channels 120, and a number of timing generators and format circuits (T/Fs 122) coupled between the pattern generator and the PE channels. The test site controller 112 is a special purpose computer or controller that couples to every component or element in test site 104, including the clock 116, the pattern generator 118, the T/Fs 122 and the PE channels 120, for controlling the operation thereof For purposes of clarity the coupling of the test site controller 112 to components in test site 104 is not shown in FIG. 1. In one embodiment, the test site controller 112 is a standard commercially available controller implemented on a separate circuit board or boards in the tester, which can be easily replaced to upgrade or modify the tester. Alternatively, the test site controller 112 is implemented as part of the host computer 110.

Each PE channel 120 includes a PE driver 124 capable of coupling signals to a pin 108 of the DUT 106, a comparator 126 for comparing an output signal with an expected output signal, and an error logic circuit 128 for coupling results of the comparison to an error capture memory (not shown) in the test site controller.

In operation, the test site controller 112 loads test signals or patterns, commonly known as test vectors, into the pattern generator 118. The clock 116 generates system clock signals which are provided to the pattern generator 118, the T/Fs 122 and the PE channels 120. The pattern generator 118 stores and sequences test vectors used during the testing process. The T/Fs 122 adjust the timing and formatting of various signals of the test vectors, i.e., data, strobe and input/output (I/O) control signals, received from the pattern generator 118 and couple the output from the pattern generator to the DUT 106, through the PE channels 120.

In accordance with the present invention, the test system module or tester 102 is stackable. That is the tester 102 is adapted to be mechanically coupled, affixed or fastened to at least one other substantially identical tester, or to a common holding frame (not shown in this figure). Advantages of stackable testers 102 include their ability to function as a standalone test system 100 where small pin count devices 106 are to be tested, for example DUTs having less than 64 pins. Larger pin count test systems 100 can be achieved by simply stacking these standalone testers 102. This significantly reduces the design and manufacturing costs for the test system manufacturer for both the mechanical and electrical features of the testers. It also allows a customer to purchase a small test system 100 at a low initial cost and to expand the pin count of that system in the future by adding more testers 102 as required. Another advantage of a stackable tester is that spare parts purchased by the customer are the same for all sizes and configurations of test systems, thus, minimizing the customer's spare parts cost, storage space, and maintenance technician training.

Components, features and elements of the tester 102 and test system 100 of the present invention that enable the tester to be mechanically coupled or stacked will now be described with reference to FIGS. 2 through 12.

Figure 2:
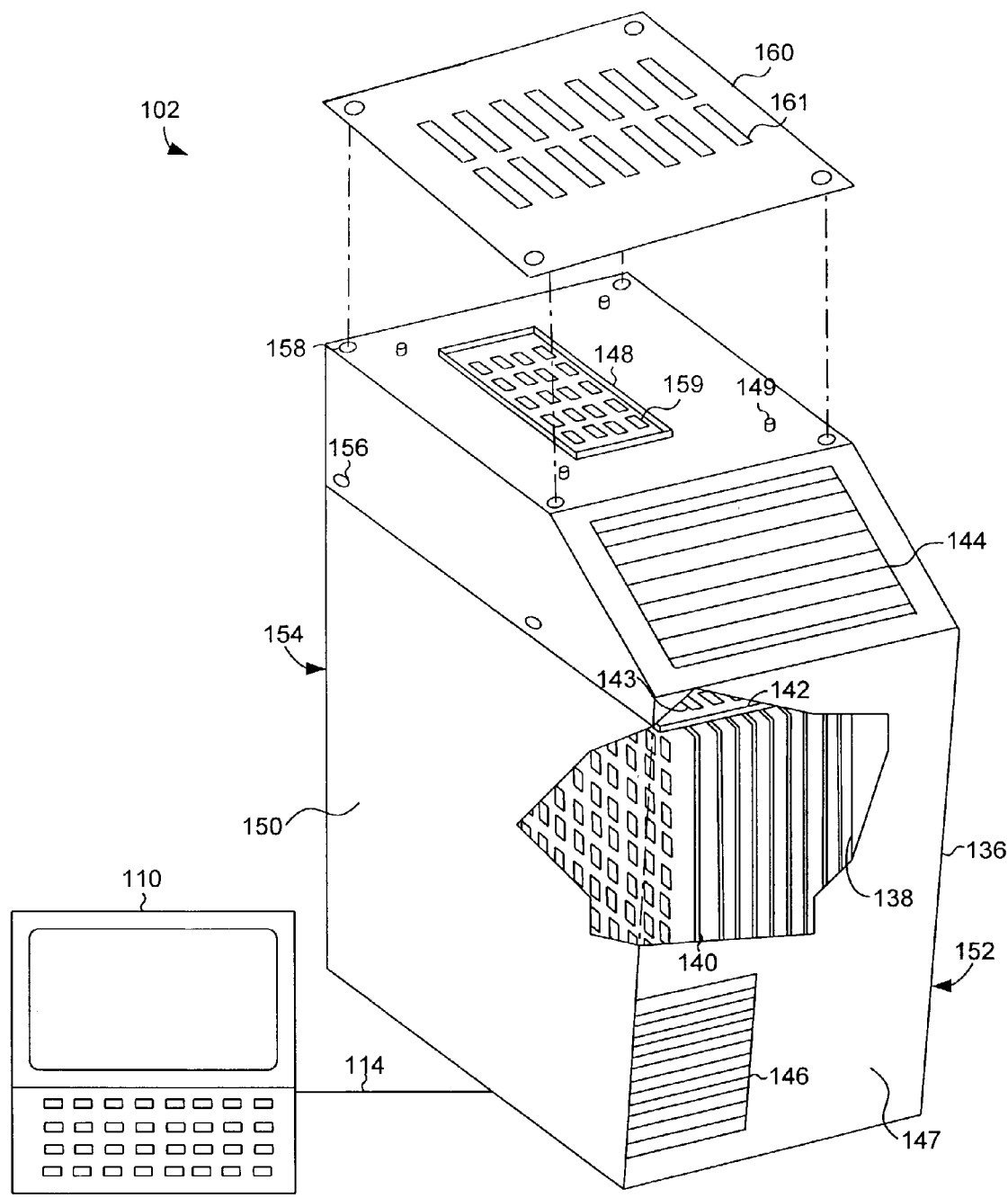
FIG. 2 is a perspective and partial cut-away view of a tester according to an embodiment of the present invention.

FIG. 2 shows a single tester 102, which can operate as a standalone test system 100. The host computer 110 may be separate, as shown, or integrated within the tester 102 (not shown). Referring to FIG. 2, the tester 102 generally includes within one enclosure 136 one or more power supplies 138, one or more test sites, and often a test site controller. The test sites 104 and test site controller 112 are embodied in a number of printed circuit (PC) boards 140 or daughter boards depending from edge connectors (not shown) often attached to a backplane 142. Optionally, electrical connectors 143 on the backplane 142 enable the tester 102 to be electrically coupled with additional testers as described below.

The tester 102 also includes a cooling subsystem or mechanism including, for example, first vents 144 in a top surface 145 of the tester, second vents 146 in a front surface 147 of the tester and a fan (not shown in this figure) to flow air through the vents to cool internal components of the tester. A DUT interface 148 interfaces with the DUT 106 via a DUT board 160. In the embodiment shown, the DUT interface 148 comprises a number of electrical connectors 159 or sockets that mate with the DUT board 160, and couple through a number of second electrical connectors 161 with the DUTs 106. Alternatively, the DUT interface 148 can comprise ribbon cables, pogo pins or other types of connectors such as edge connectors to couple circuit boards of the PE channels 120 directly to the DUT board 160. A docking mechanism with a number of docking or attachment points 149 positions, holds and locks the DUT board in place above the top surface 145 of the tester 102 and aligns the DUT board with the DUT interface 148. Preferably, the tester 102 further includes an extension mechanism 151 (shown in FIGS. 9-12) that automatically raises or extends the DUT interface 148 up past or through the top surface 145 to engage the DUT board, and retracts the DUT interface to disengage from the DUT board, and to protect connectors of the DUT board interface when the DUT board is not installed. The extension mechanism 151 can employ any suitable mechanism for extending and retracting the DUT interface 148. For example, the extension mechanism 151 can include pneumatic cylinders, an electric motor or other actuators such as solenoids. More preferably, the extension mechanism 151 further includes an interlock (not shown) that prevents the DUT interface 148 from being extended if the DUT board is not properly positioned above the top surface 145 of the tester 102. An improperly position DUT board will result in some DUT interfaces 148, or portions thereof, engaging the DUT board before others. This in turn can cause further in-alignment or improper positioning of the non-engaged DUT interfaces, resulting in damage to the DUT board, DUT interfaces 148 and the extension mechanism.

In an alternative embodiment, the docking mechanism further includes a docking drive (not shown) in the testers 102 coupled to the attachment points 149. In this embodiment, the DUT interfaces 148 are fixed in a raised position extending through top surfaces 145, and the DUT board is pulled down onto the top surfaces by the docking drive. The docking drive can include, for example, an electric motor with a chain and sprocket drive to turn lead screws coupled to the attachment points 149 attaching to the DUT board. Preferably, the docking drive further includes a synchronization mechanism that prevents uneven lowering of or application of force to the DUT board, thereby preventing damage to the DUT board, DUT interfaces 148 and the docking mechanism, as described above.

The tester 102 of the present invention is adapted to be stacked or be mechanically coupled to at least one other substantially identical tester along either side surface 150, 152, or a back surface 154 without interfering with operation of the tester. The testers 102 can be coupled directly to one another, for example, by means of plates and bolts (not shown) inserted in threaded bolt holes 156 along either side 150, 152, of the tester or in the back surface 154. Alternatively, the testers 102 can be coupled to a common holding frame, for example, through threaded bolt holes 158 on the top surface 145 of the testers.

Figure 3:
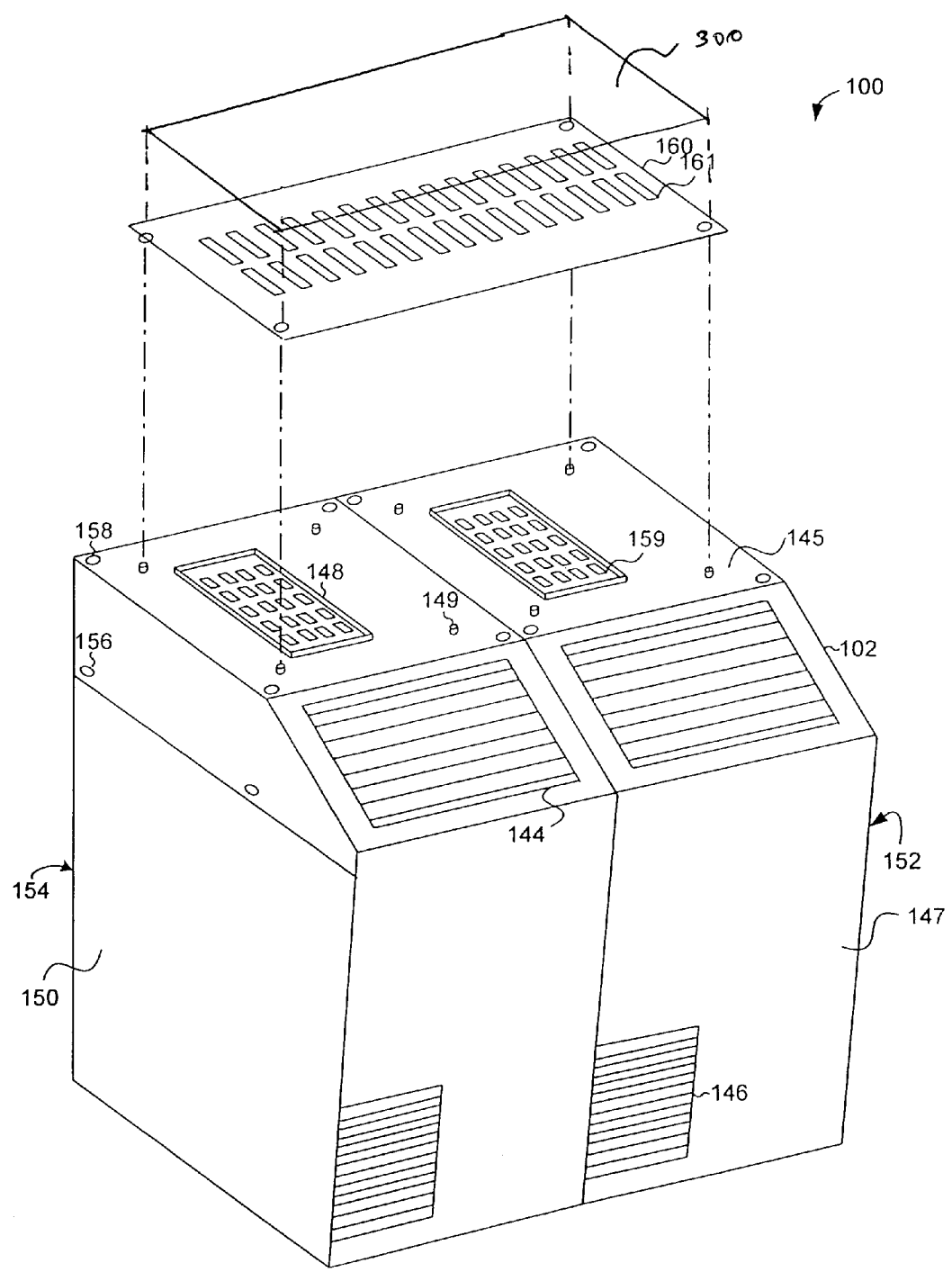
FIG. 3 is a perspective view of a pair of mechanically coupled or stacked testers according to an embodiment of the present invention.

FIG. 3 is a perspective view of a pair of testers 102 mechanically coupled or stacked along one side, and adapted for use with a single DUT board 160, as described above. This embodiment is particularly suitable for situations in which a manufacturer having previously purchased a single tester 102 for use as a standalone test system 100 subsequently needs to add a second tester either to increase the volume of DUTs 106 that can be tested simultaneously or to test DUTs having a number of pins 108 greater than can be accommodated on a single tester. Stacking or mechanically coupling the testers 102 enables the use of a common or shared DUT material handler 300 for moving or positioning the DUT 106 and automatically coupling DUTs to the DUT board. By material handler it is meant any suitable material handler having means for holding and electrically coupling the DUT 106 with the test system 100 including, for example, probers, strip or panel handlers, and vertical plane or gravity feed handlers.

Additionally, the extendable DUT interfaces 148 on the testers 102 makes possible the use of a single DUT board 160 simultaneously engaging DUT interfaces on both testers. Use of a single or common DUT board 160 is desirable to facilitate the use of a shared DUT material handler, and to enable testing of DUTs 106 having a number of pins 108 greater than can be accommodated on a single tester 102. In contrast to the tester 102 of the present invention, conventional testers typically use an electric or pneumatic docking mechanism that forces the DUT board 160 on to a rigid or fixed DUT interface 148. Although this is acceptable for engaging a DUT board 160 with the DUT interface 148 of a single tester 102, it is difficult to maintain proper alignment when mating the DUT board into two separate DUT interfaces. Moreover, because of the number of connections to be made and the resultant force required to engage the DUT board 160 with the DUT interface 148, it is probable that engagement with one of the interfaces will proceed more quickly than the others, causing a misalignment that could result in damage to the DUT board, testers 102 or both. Thus, mechanical synchronization between testers would be required.

Figure 4:
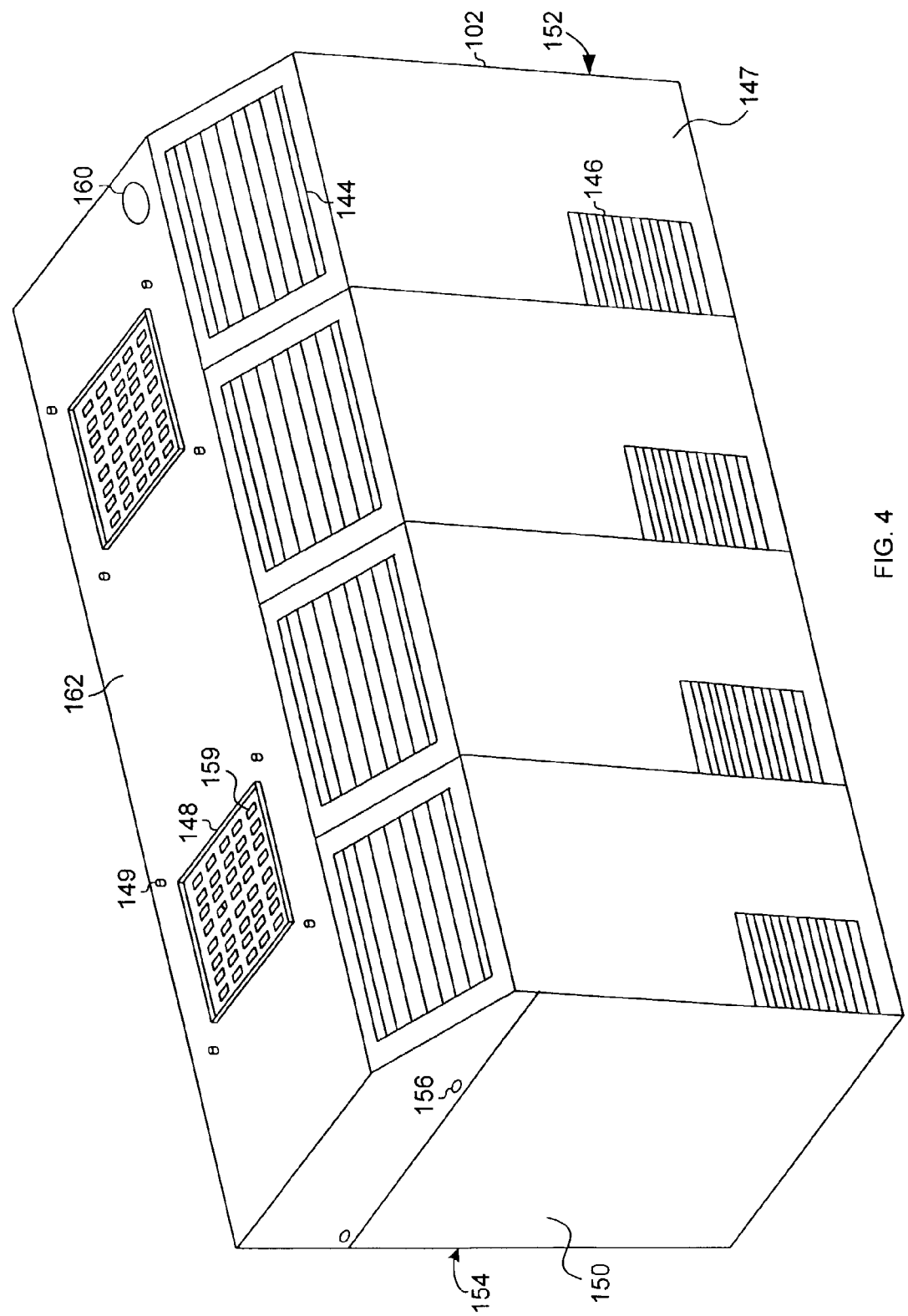
FIG. 4 is a perspective view of four mechanically coupled or stacked testers according to an embodiment of the present invention.

A larger version of the test system 100 of FIG. 3 is shown in FIG. 4. FIG. 4 is a perspective view of four mechanically coupled or stacked testers 102 according to another embodiment of the present invention. In this embodiment, the top surface 145 of each of the four individual testers has been replaced with a single, common top surface 162 which combines or groups the DUT interfaces 148 of adjoining testers into a single larger DUT interface in two portions or areas of the common top surface. This is desirable to facilitate the use of a single DUT board 160 and/or material handler. Generally, the top surface 145 is a flat sheet of material, such as metal that covers the backplane 142. Moreover, the extension mechanism 151 and DUT interface 148 is electrically coupled to the test sites 104 on the circuit boards 140 through flexible connectors or cables 164 and can be quickly and easily re-located to several predetermined anchor points or locations on the backplane 142. Thus, grouping or combining the DUT interfaces 148 and replacing the top surfaces 145 with a common top surface 162 can be readily done in-situ by operators or maintenance technicians. This is particularly advantageous for situations such as those described above in which a manufacturer desires to add testers 102 to an existing test system 100.

Also in this embodiment, an emergency power off or EPO switch 166 and circuit (not shown) has been added to the common top surface 162 to enable the operator to quickly shut off power to all four testers 102 in the event of an emergency. In one embodiment, the EPO circuit includes an added circuit breaker through which power to all testers 102 is routed. Alternatively, the EPO switch 166 can be connected across two terminals in series with a power switch of each tester 102, which are shorted by a jumper or shunt when the EPO switch 166 and circuit are not required. An advantage of this last approach is to simplify installation of the EPO circuit and EPO switch 166 enabling the installation to be done in-situ by operators or maintenance technicians.

Figure 5:
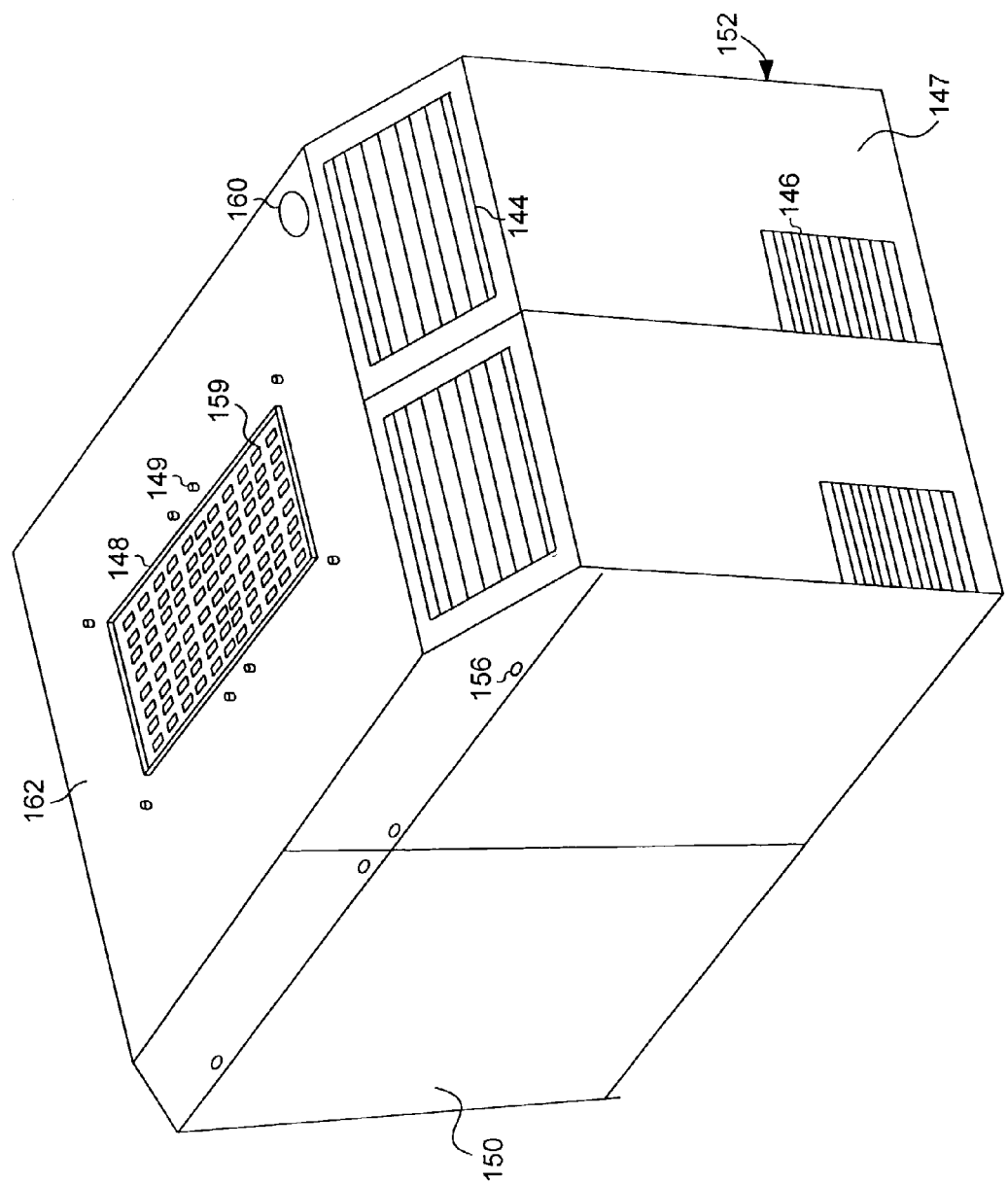
FIG. 5 is a perspective view of two pairs of mechanically coupled or stacked testers according to another embodiment of the present invention.

FIG. 5 is a perspective view of two pairs of mechanically coupled or stacked testers 102, each member of a pair stacked along a single side, and each pair stacked back to back. This embodiment may be desired over the embodiment of FIG. 4 when, for example, the testers 102 are to be affixed to a common holding frame of a manipulator, as described in more detail below. As above, the top surface 145 of each of the four individual testers 102 has been replaced with a common top surface 162 which combines or groups the DUT interfaces 148 in a portion of the common top surface. In one version of this embodiment, the common top surface 162 is made from a flat sheet of material that can be rotated or reversed to locate the DUT interfaces 148 in a desired portion of the common top surface 162.

Figure 6:
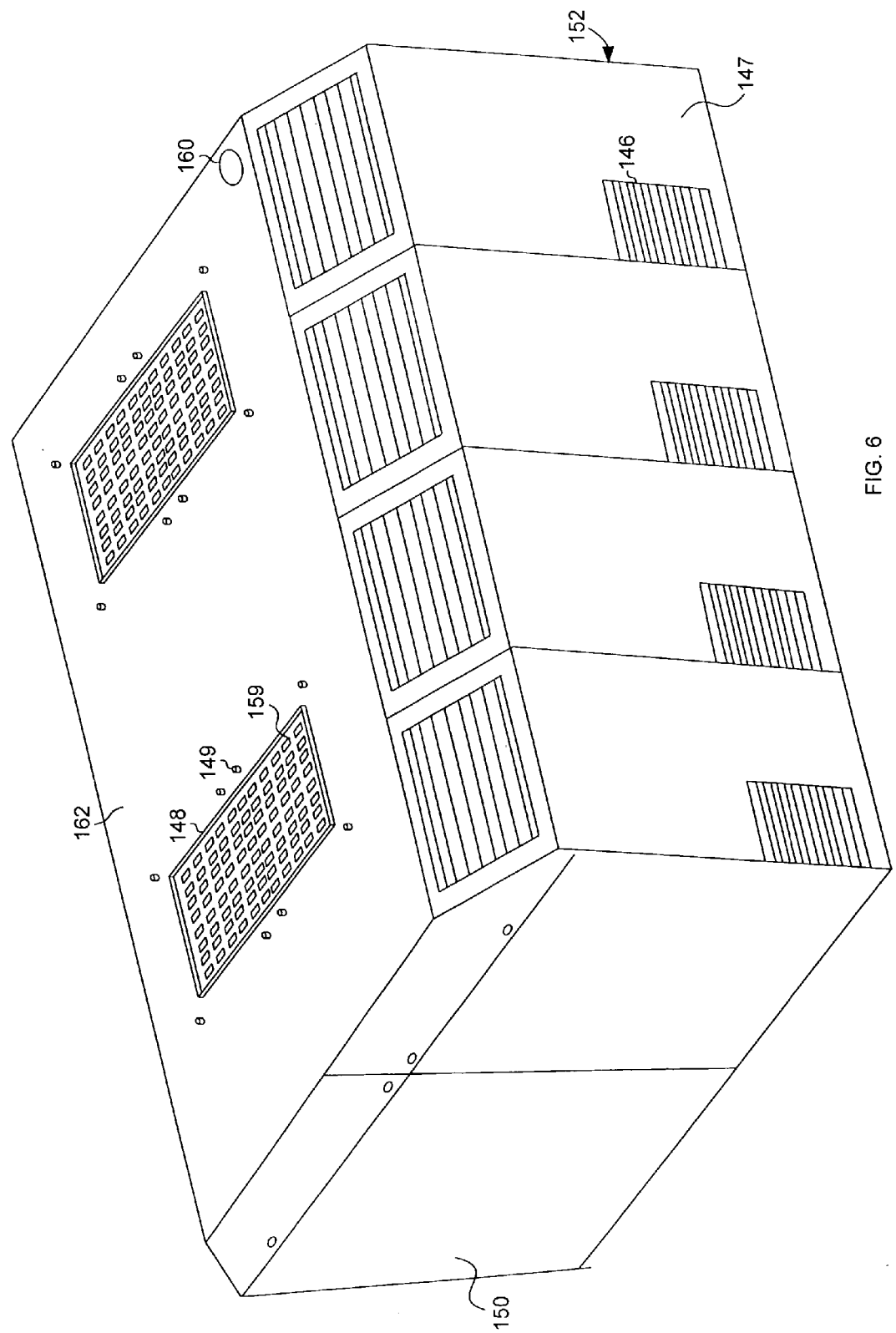
FIG. 6 is a perspective view of eight mechanically coupled or stacked testers according to an embodiment of the present invention.

FIG. 6 is a perspective view of eight mechanically coupled or stacked testers 102 similar to that shown in FIG. 5. Again, the top surface 145 of each individual tester 102 has been replaced with a common top surface 162, and the DUT interfaces 148 grouped into two portions of the common top surface. Two portions allows for short signal routing paths on a wafer prober or to a contact set on a package handler.

Figure 7:
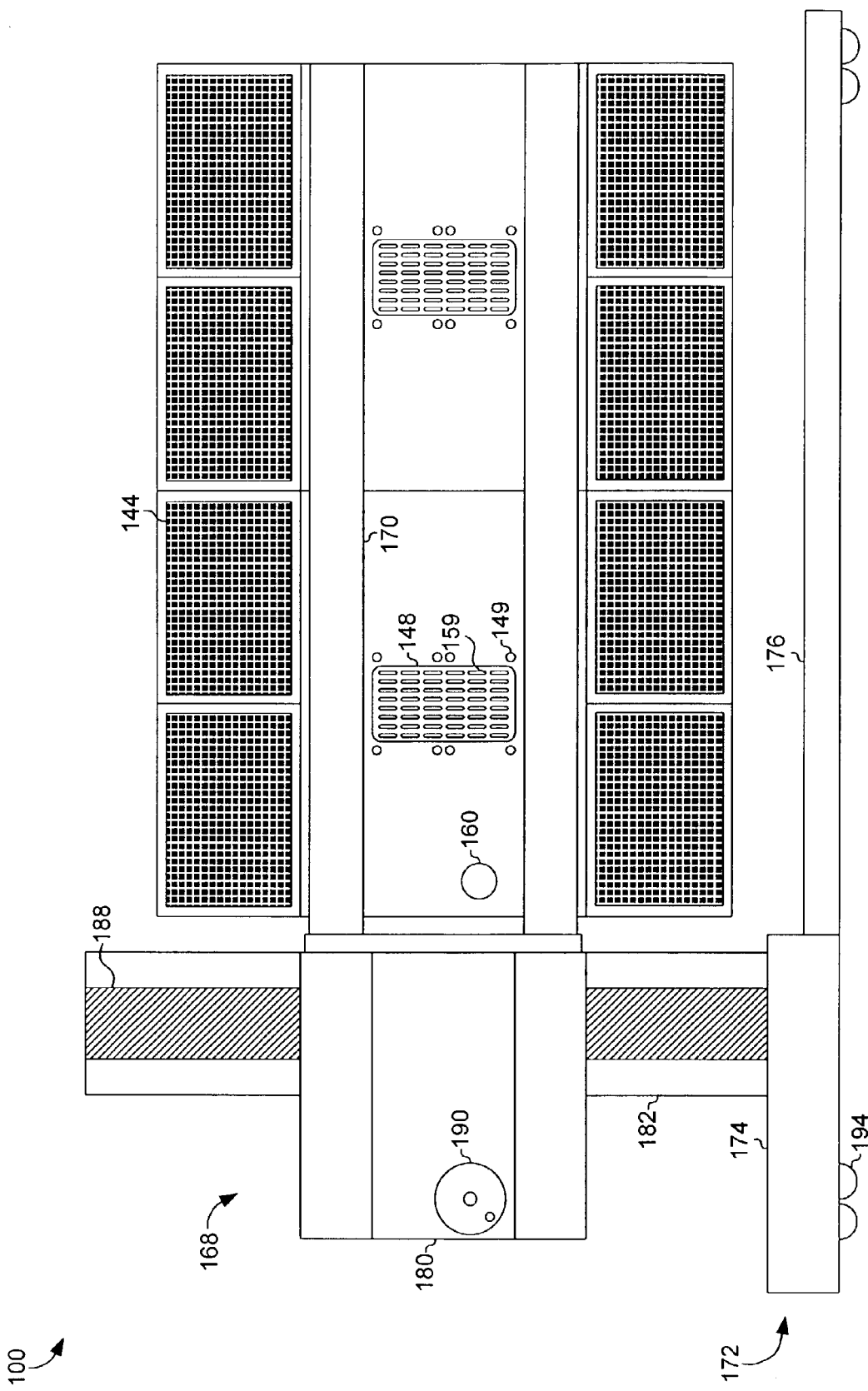
FIG. 7 is a side view of mechanically coupled or stacked testers affixed to a common holding frame of a manipulator according to an embodiment of the present invention.

FIG. 7 is a side view of a manipulator 168 having a common holding frame 170 to which eight mechanically coupled or stacked testers 102 are affixed according to an embodiment of the present invention. Generally, the manipulator 168 includes: (i) a base assembly 172 having a platform 174 with two horizontal legs 176 (only one of which is shown) extending therefrom; and (ii) a column assembly 178 extending vertically from the platform 174 and to which the common holding frame 170 is movably coupled. The column assembly 178 includes a carrier 180 to which the common holding frame 170 is attached, an upright or support member 182 for supporting the carrier, and a drive mechanism (not shown) to lift and position the carrier vertically along the support member. Support member 182 also has a polygonal cross-section to prevent twisting that could result in undesirable yawing motion of test system 100 on common holding frame 170. The drive mechanism can include an electrical, hydraulic, or pneumatic motor (not shown) or a manual crank in the carrier 180 that engages a lead screw 188 to raise or lower the carrier relative to the support member 182. In the embodiment shown, the carrier 180 further includes a control wheel 190 to reposition the carrier along on the support member 182 and to lock the carrier in position during testing. Preferably, the column assembly 178 further includes a rotating member 192 rotatably coupled to the carrier 180 and to the common holding frame 170 to enable the stacked testers 102 to be rotated relative to the column assembly 178. This embodiment facilitates precisely positioning the test system 100 with the DUT board 160 fixed thereon relative to a DUT material handler.

More preferably, wheels 194 in the platform and in the legs 176 enable the test system 100 to be quickly and easily relocated within a facility or fab from a standby location to a testing area, or between multiple testing areas within the fab or even between multiple fabs, thereby saving on both floor space and investment in testing systems.

Figure 8:
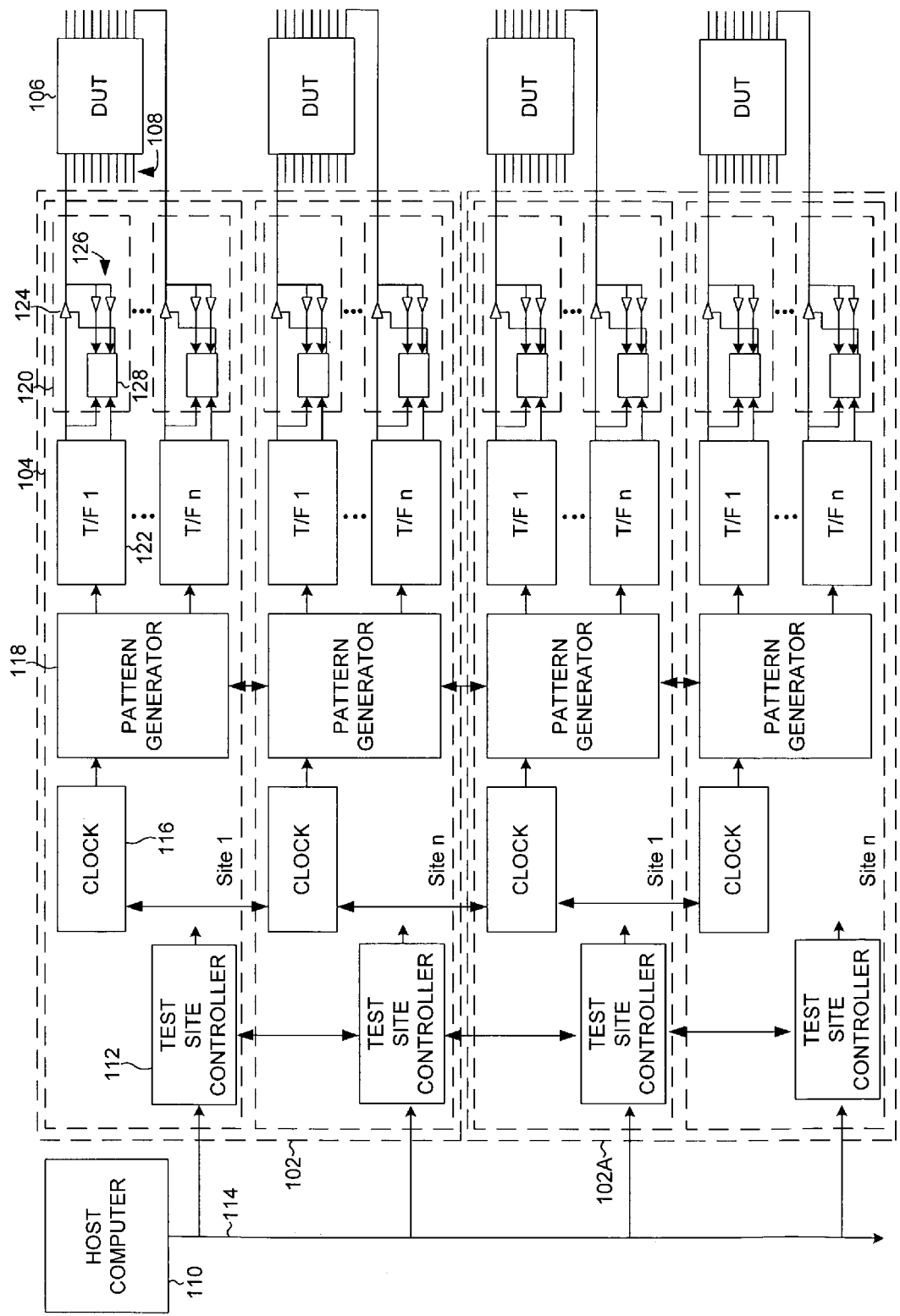
FIG. 8 is a block diagram of a test system having a pair of electrically coupled testers each with one or more test sites according to an embodiment of the present invention.

In another aspect of the invention, the testers 102 are mechanically and electrically coupled to enable testing of DUTs 106 having a number of pins 108 greater than can be accommodated on a single tester. FIG. 8 is a block diagram of a test system 100 having a pair of electrically coupled testers 102, 102A each with two electrically coupled test sites 104 according to an embodiment of the present invention. Referring to FIG. 8, it is seen that electrical coupling between testers 102, 102A, and between test sites 104 within each tester, include signaling and communication paths between the test site controllers 112, the clocks 116, and the pattern generators 118. Electrical coupling of test sites 104 within each tester 102 is accomplished in the tester. To facilitate electrical coupling of mechanically coupled or stacked testers 102, electrical connectors are provided that are accessible through the enclosures 136 of the testers. In one version of this embodiment, the connectors 143 (shown in FIG. 2) are located on the backplane 142, and are accessed by removing an air-filter on the front intake vents 144. Cables pass from one backplane 142 to another through prefabricated openings in the sides 150, 152, of the enclosures by opening a door or removing a plug. The cables or conductors can include ribbon cables, optical fiber, co-axial cables, twisted-pairs or other conductors. Generally, one or more cables jumper or couple about 50 signals between backplanes 142.

The tester 102 of the present invention incorporates several features or adaptions that enable it to be coupled to another tester, preferably a tester having a substantially identical chassis or enclosure, along either side surface 150, 152, or in a back surface 154 substantially without interfering with operation of the tester. As explained above, the docking mechanism, extendable DUT interfaces 148 and common top surface 162 makes possible the use of a single, common material handler and a single DUT board 160 simultaneously engaging DUT interfaces on stacked testers 102.

Similarly, electrical connectors 143 accessible through the enclosures 136 of the testers 102 enable electrical coupling of stacked testers. It will be understood that testers 102 mechanically stacked and/or electrically coupled according to the present invention need not be substantially identical electrically. In some embodiments stacked testers 102 forming a single test system can each include a different number of test sites 104 or different performance level or features in each stacked tester. For example, a device manufacturer who previously purchased a tester 102 having a single site 104, may purchase and couple to it a second tester having multiple test sites. In one version of this embodiment, the testers 102 while having different numbers of test sites 104 can have substantially identical chassises or enclosures. Alternatively, as provided above, the testers 102 need not have substantially identical chassises or enclosures. However, it is desirable that some of the dimensions of the side surfaces 150, 152, and/or back surfaces 154 along which the testers are stacked are substantially identical.

Other features of the tester 102 of the present invention that facilitate stacking include the ability to access the circuit boards 140 and other internal components while stacked, and the cooling subsystem or mechanism.

With regard to the ability to access the circuit boards 140 and other internal components while stacked, substantially all of the lower portion of the enclosure 136, that is the portion below bolt holes 156 and front intake vents 144, can be removed by removing one or more fasteners (not shown) attaching the enclosure to the tester 102, and dropping the lower portion of the enclosure 136 downward. It will be appreciated that this arrangement results in all of the circuit boards 140, the power supplies 138 and all or substantially all of the backplane 142 being accessible even while the tester is stacked. In one preferred version of this embodiment the lower portion of the enclosure 136 is held on by a single screw or fastener (not shown) in the lower or bottom surface of the tester.

Figure 9:
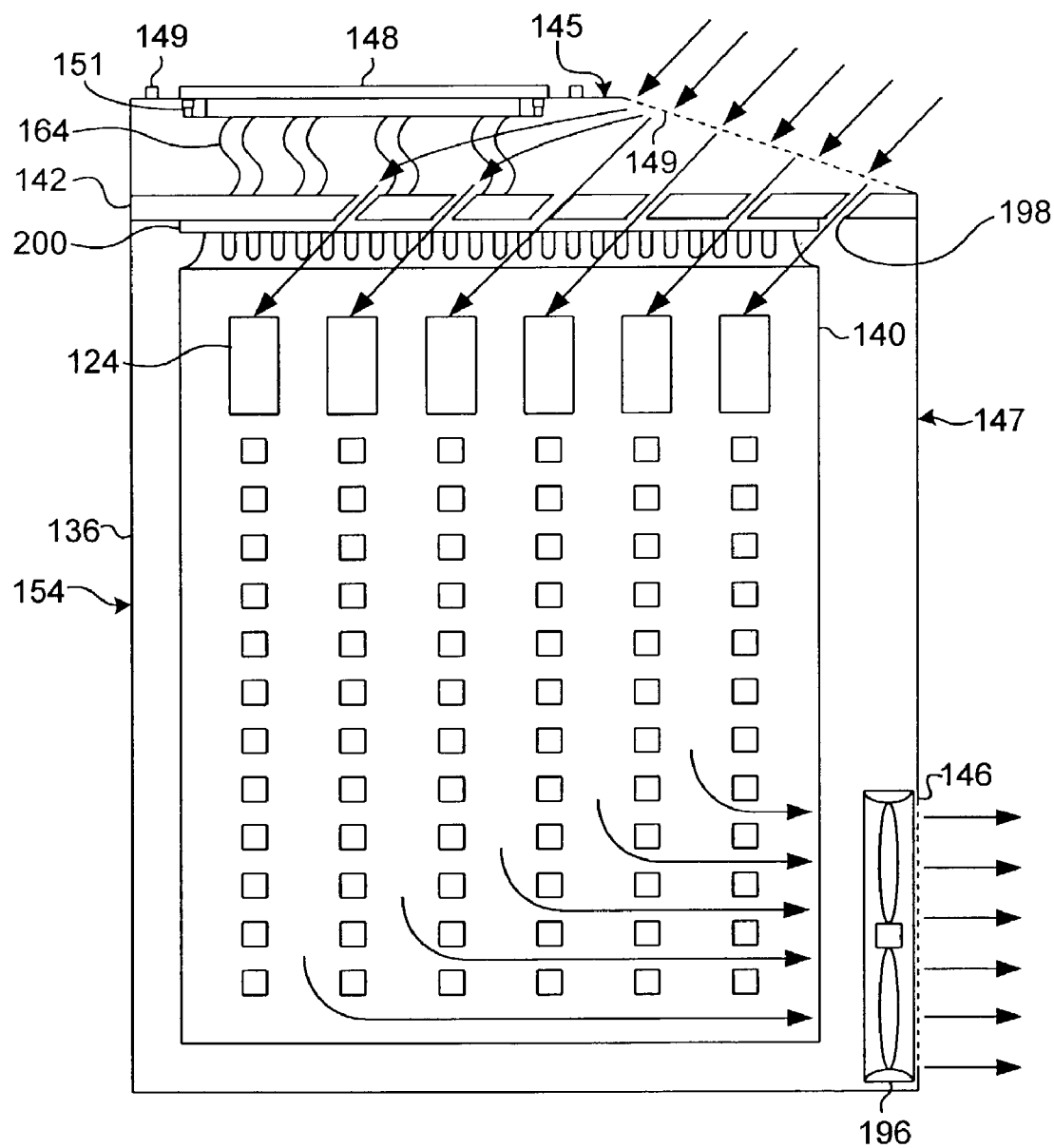
FIG. 9 is a sectional side view of a tester having a backplane with daughter boards depending therefrom and a number of openings therein to direct air flow over components on the daughter boards according to an embodiment of the present invention.

With regard to the cooling subsystem, conventional lower cost testers typically rely on a fan and vents in the front and back surfaces or in the side surfaces of the tester to provide a cross-flow of air to cool internal components of the tester. It will be understood that such an approach would not work with the inventive tester 102, which must be able to mechanically couple or stack with additional testers along the back surface 154, either side surface 150, 152, or all three. In a preferred embodiment, shown in FIG. 9, the tester 102 includes a cooling subsystem having a fan 196, vents 144 in the top surface 145 and vents 146 in the front surface 147 of the tester, and openings or holes 198 in the backplane 142. The holes 198 in the backplane 142 permit air drawn by the fan 196 to flow from the vents 144 in the top surface 145 through the backplane 142, over or past components on the circuit boards 140, and out through the vents 146 in the front surface 147. As shown in FIG. 9, the top surface 145 of the tester 102, or the portion having vents 144 therein can be angled relative to the top surface 148 to provide an unrestricted air intake opening when the tester is docked to a material handler with a large surface adjacent or abutting the tester 102 top surface 148.

The number and size or cross-sectional area of the holes 198 through the backplane 142 is selected to provide sufficient cooling to components of the tester 102. Preferably, the combined cross-sectional area of the holes 198 is less than cross-sectional area of the vents 144 in the top surface 145.

Optionally, the holes 198 themselves can be positioned or oriented to focus or direct cooling air onto preselected components of the circuit boards 140, for example, the PE driver 124. Because of the high speed of the signals necessary to drive the DUT 106, the PE driver 124 typically generates a fair amount of heat, which must be dissipated to ensure proper operation and continued operation. Consequently in one version of this embodiment, the holes 198 are adapted to direct cooling air onto the PE drivers 124. Moreover, because the PE drivers 124 should be located as close to the DUT 106 as possible to eliminate errors due to delay in transmission and reception of test vectors, they are generally located in a line at the top of the circuit board 140 near the edge connector 200. Thus, it will be appreciated that the cooling subsystem of the present invention is a tremendous improvement over the prior art, in which cooling air from vents in the front and back surfaces of the tester flows across the circuit board parallel to the line of PE drivers. As a result of this parallel flow, in conventional air cooled testers the last PE driver in a line of PE drivers receives pre-heated air, resulting in reduced cooling and higher operating temperatures. Higher operating temperatures of the PE driver can lead to poor reliability or thermal shutdown of the PE driver 124 if it has thermal protection.

Figure 10:
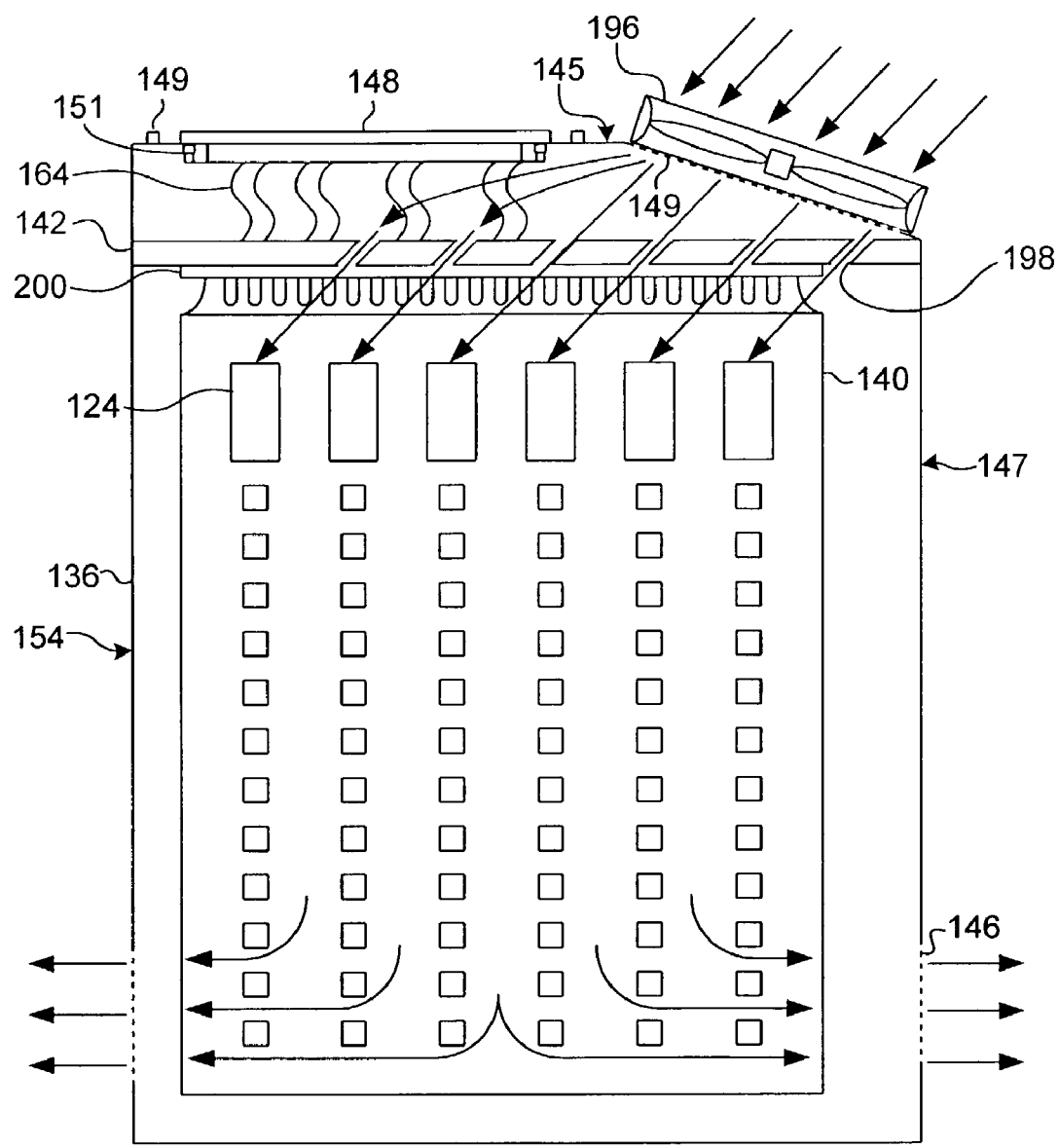
FIG. 10 is a sectional side view of an alternative embodiment of the tester of FIG. 9 having vents in a top surface above the backplane, vents in one or more surfaces below the backplane, and in which a fan is positioned adjacent to the vents in the top surface.

In another embodiment, shown in FIG. 10, the fan 196 is positioned adjacent to the vents 144 in the top surface 145, enabling space between the vents 144 and the backplane 142 to be pressurized, and thereby providing a more uniform flow of air from each of the holes 198. In addition, the lower vents 146 can be spread across one or more surfaces of the lower portion of the enclosure 136 below the backplane. This arrangement of the lower vents 146 may be desirable to provide increased air flow in certain stacked configurations or where the tester 102 is not stacked. The ease with which the lower portion of the enclosure 136 can be removed, described above, facilitates reconfiguring the tester 102 for stacked and unstacked use.

Figure 11:
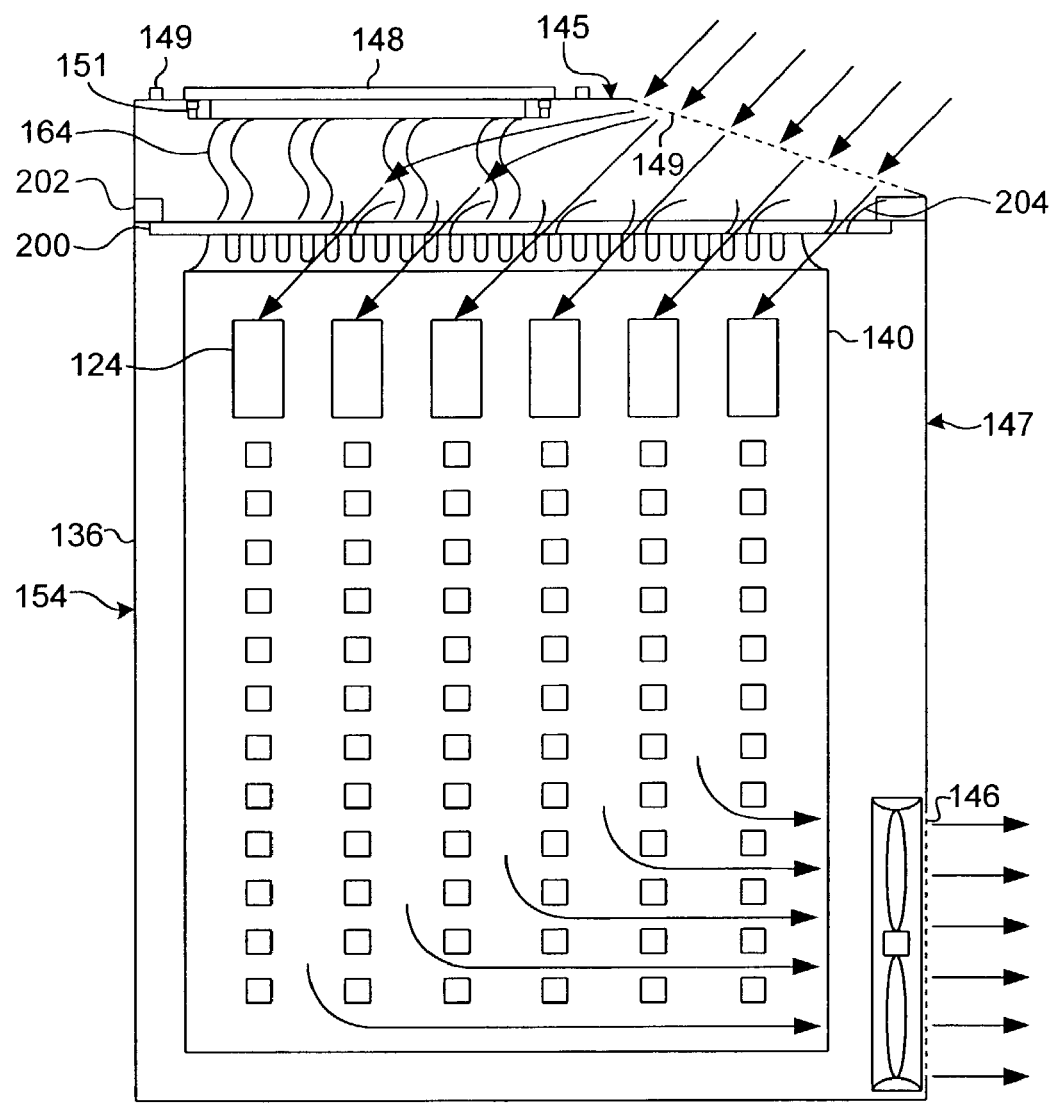
FIG. 11 is a sectional side view of a tester having edge connectors with daughter boards depending therefrom and baffles between the edge connectors to direct air flow over components on the daughter boards according to an embodiment of the present invention.

In yet another embodiment, shown in FIG. 11, the backplane 142 is entirely or substantially eliminated and the circuit boards 140 depend from edge connectors 200 affixed to a structural frame 202 in the tester 102 or directly to the enclosure 136. In this embodiment the air flow is directed from the top vents 144, between the edge connectors 200 of multiple layers of circuit boards 140, and over components on the circuit boards. Optionally, the cooling subsystem can further include ducts or baffles 204 between the edge connectors 200 oriented to focus or direct cooling air onto preselected components on the circuit boards 140, in a manner similar to the backplane 142 having holes 198 described above.

Figure 12:
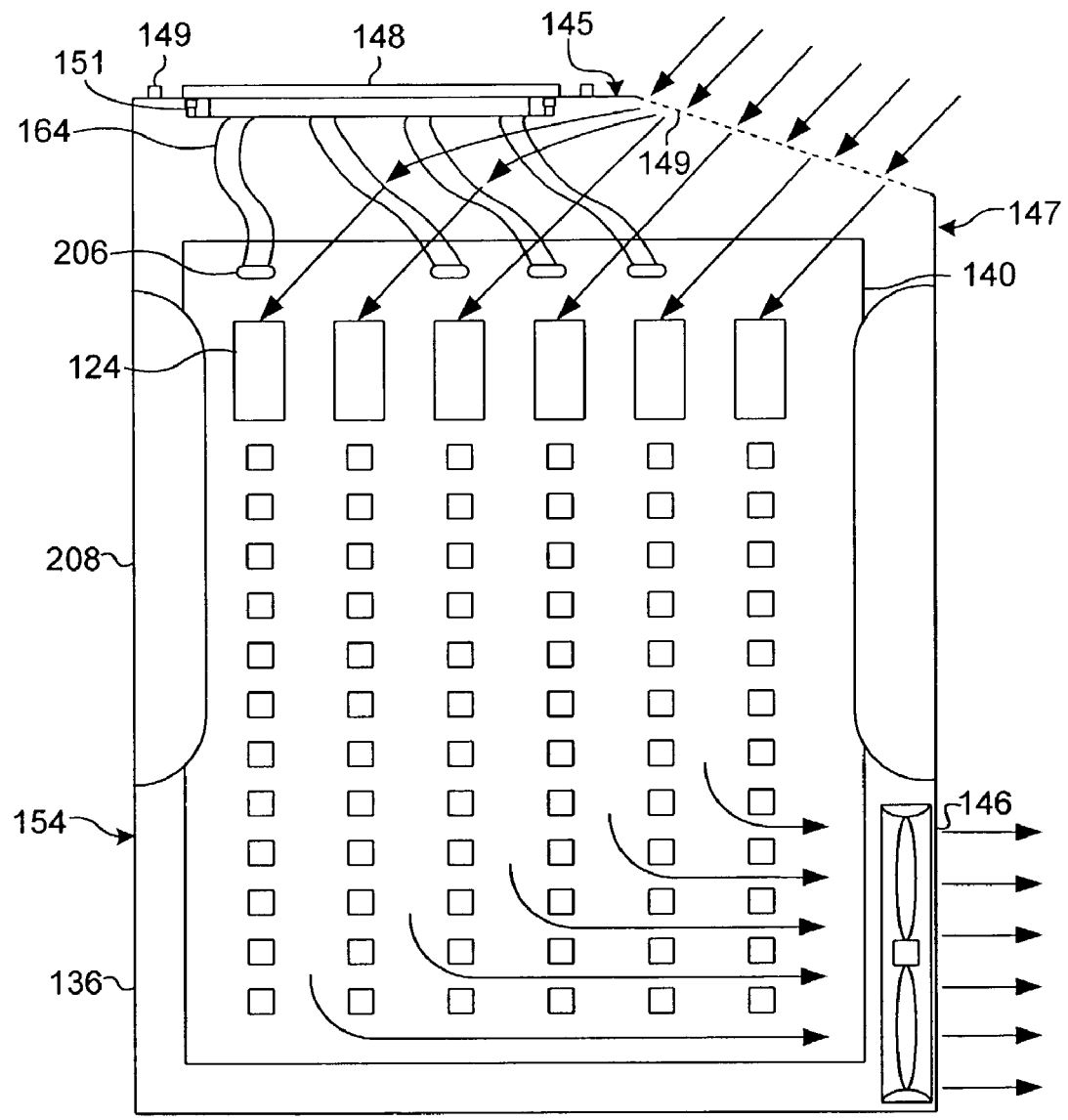
FIG. 12 is a sectional side view of yet another embodiment of a tester according to the present invention, in which circuit boards are coupled directly via ribbon cables or pogo pins to the DUT interface, and air flow is directed between the circuit boards and over components thereon.

In an alternative embodiment, shown in FIG. 12, the edge connectors 200 are removed completely, and the circuit boards 140 are coupled directly via ribbon cables 164 or pogo pins to the DUT interface 148 or to the DUT board 160. In this arrangement, the circuit boards 140 are held in position by guides 208 attached to the enclosure 136 or a frame member (not shown) of the tester 102, thereby enabling air flow to be directed between the circuit boards and over components thereon.

Figure 13:
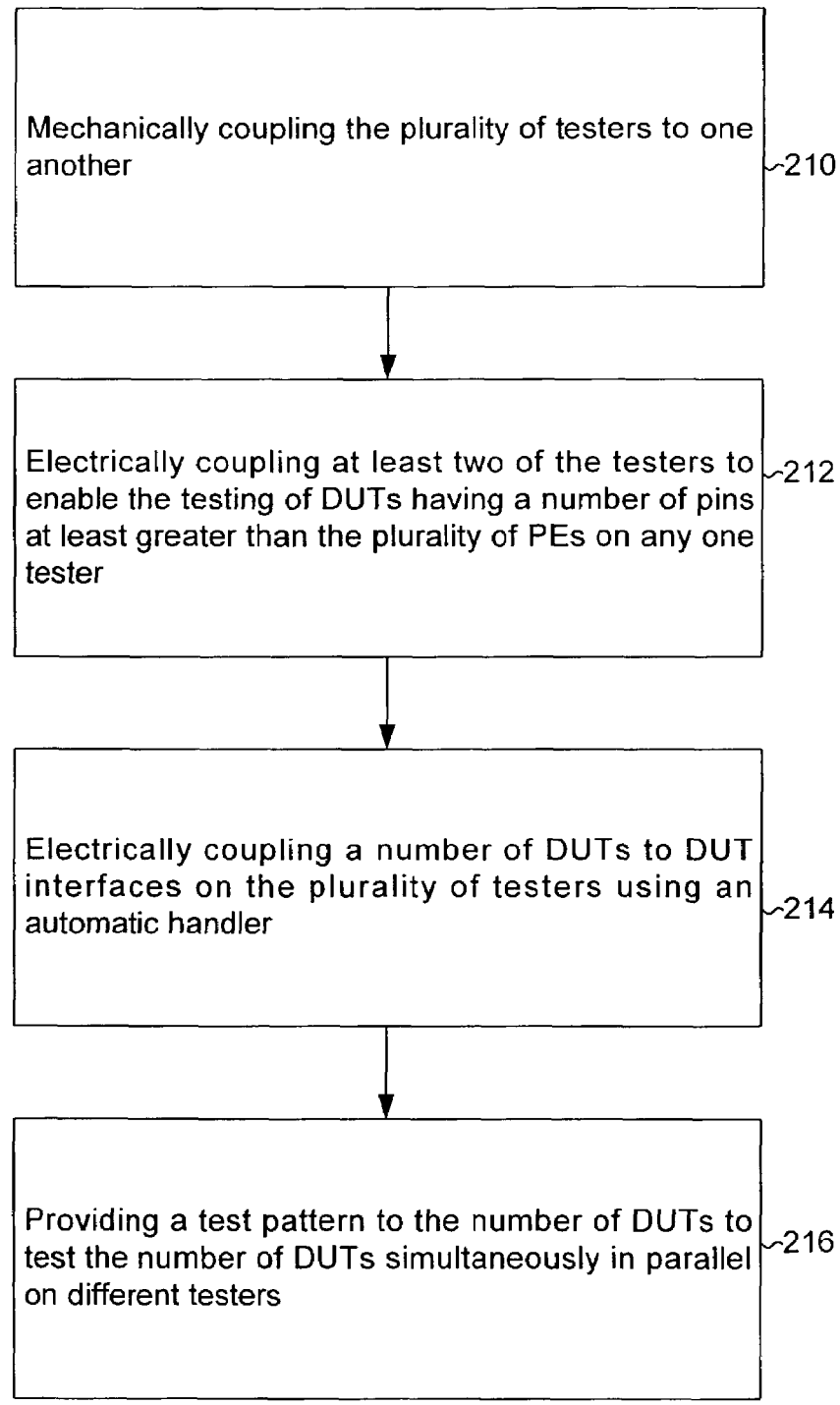
FIG. 13 is a flowchart showing a process for testing a DUT using a test system having a number of mechanically coupled testers according to an embodiment of the present invention.

A method or process for testing a DUT 106 using a test system 100 having stackable testers 102 will now be described with reference to FIG. 13. FIG. 13 is a flowchart showing a process for testing a DUT 106 using a test system 100 having a number of mechanically coupled testers 102 according to an embodiment of the present invention. Referring to FIG. 13, the process begins with the initial step of stacking or mechanically coupling the testers to one another (step 210). Where the testers 102 are also adapted to be electrically coupled, at least two of the testers together can be electrically coupled to enable the testing of DUTs 106 having a number of pins greater than the number of PE channels 120 available on any single tester (step 212). Next, a number of DUTs 106 are electrically coupled to DUT interfaces 148 on the stacked testers 102 using a DUT board 160 and an automatic material handler (step 214). A test pattern is provided to the DUTs 106 to test the number of DUTs simultaneously in parallel on different testers 102 (step 216). Optionally, where the DUT 106 under test has a number of pins 108 greater than the PE channels 120 available on any one tester 120, the step of providing a test pattern to the DUT, step 216, comprises the step of providing a test pattern to at least one DUT having a number of pins at least greater than the plurality of PE channels 120 on any one tester.

The advantages of a test system 100 with the stacked testers 102 of the present invention, and method of using the same include any or all of the following:

(i) increased efficiency and utilization of test system 100 resources by enabling multiple discreet test system modules 102 to be linked to accommodate DUTs 106 having a number of pins 108 greater than the number of PE channels 120 on any single test system module;

(ii) increased efficiency and utilization of test system 100 resources by enabling an existing test system having a test system module 102 according to the present invention to be quickly and easily expanded to accommodate new, larger DUTs 106;

(iii) increased efficiency and utilization of test system 100 resources by enabling parallel testing of a large number of the same or similar DUTs 106;

(iv) conserving floor space in a manufacturing facility by reducing or minimizing system footprint for test systems 100 having larger capacity;

(v) increased manufacturing efficiency by reducing volume of spare parts and assembly documentation maintained per test system 100; and (vi) increased manufacturing efficiency by reducing manufacturing and service training required per test system 100.

It is to be understood that even though numerous characteristics and advantages of certain embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

What is claimed is:

1. A test system for testing at least one device under test (DUT) comprising first and second testers and a coupler for mechanically coupling the first and second testers together, each of the first and second testers having a pattern source configured to output test signals, a DUT interface having a plurality of electrical connectors and a plurality of pin electronics (PEs) channels configured to couple test signals from the pattern source to the plurality of electrical connectors, wherein the DUT interfaces of the first and second testers are configured to couple to a single DUT board that couples to the at least one DUT.

2. A test system according to claim 1, wherein at least a portion of side surfaces of the first tester are free of essential connectors that would impede mechanically coupling the first tester side-by-side with the second tester.

3. A test system according to claim 1, wherein at least a portion of a back surface of the first tester is free of essential connectors that would impede mechanically coupling the first tester back-to-back with the second tester.

4. A test system according to claim 1 further comprising a third such tester, wherein at least a portion of a back surface and side surfaces of the first tester are free of essential connectors that would impede mechanically coupling the first tester side-by-side with the second tester and back-to-back with the third tester.

5. A test system according to claim 1, wherein each of the first and second testers includes a docking mechanism to position the DUT board over a top surface of the tester.

6. A test system according to claim 5, wherein the DUT interface of each of the first and second testers interfaces with the at least one DUT via the DUT board, and wherein each such DUT interface is extendable to engage the DUT board positioned thereover.

7. A test system according to claim 6, wherein such DUT interfaces are synchronized to simultaneously engage the DUT board positioned over the first and second testers.

8. A test system according to claim 6, wherein each of the first and second testers includes an extension mechanism configured to prevent the DUT interface from extending to engage the DUT board if the DUT board is not properly positioned over the top surface of the respective first or second tester.

9. A test system according to claim 5, wherein the docking mechanism is further configured to pull the DUT board toward the top surface of the tester to engage the DUT interface.

10. A test system according to claim 9, wherein the docking mechanism is configured to prevent the DUT board from being pulled toward the top surface of the tester to engage the DUT interface if the DUT interface board is not properly positioned over the top surface of the tester.

11. A test system according to claim 1, wherein the first and second testers are coupled to a single host computer.

12. A test system according to claim 1, wherein the first tester includes an enclosure with first vents in a top surface and second vents in a front surface thereof,
whereby internal components of the first tester can be cooled by movement of air through the first and second vents without interference from the second tester when the second tester is mechanically coupled to either side or the back of the enclosure of the first tester.

13. A test system according to claim 12, wherein the first tester includes a backplane with a number of daughter boards depending therefrom in the enclosure, and wherein the backplane comprises a number of openings therein to direct air over components on the daughter boards.

14. A test system according to claim 12, wherein the first tester includes a number of daughter boards coupled to edge connectors in the enclosure, and wherein air is directed between the edge connectors and over either side of the daughter boards to cool components thereon.

15. A test system according to claim 1, wherein the coupler is configured to fasten the first and second testers together.

16. A test system according to claim 1, wherein the coupler is configured to affix the first and second testers to a common holding frame.

17. A test system according to claim 1, wherein each of the first and second testers includes at least one direct current power supply to power electronics in the tester.

18. A test system according to claim 1, wherein each of the first and second testers includes timing and formatting circuits coupled to the PE channels.

19. A tester configured to be mechanically and electrically coupled with at least one other tester to provide a test system for testing at least one device under test (DUT), the tester comprising an enclosure, a cooling subsystem for cooling components of the tester, a pattern source, a plurality of pin electronics (PE) channels, the cooling subsystem, the pattern source and the plurality of PE channels being located within the enclosure, a DUT interface for interfacing with the DUT and being at least partially coupled to the enclosure, and at least one electrical connector accessible through an opening in the enclosure for electrically coupling with at least one other tester.

20. A tester according to claim 19, wherein the tester is configured to be mechanically coupled side-by-side with at least one other tester.

21. A tester according to claim 19, wherein the tester is configured to be mechanically coupled back-to-back with another tester.

22. A tester according to claim 19, wherein the tester is configured to be mechanically coupled side-by-side and back-to-back with at least two other testers.

23. A test system for testing at least one device under test (DUT), the test system comprising a host computer and a plurality of standalone testers coupled to the host computer, each tester having an external housing and a distinct cooling system located within the external housing for cooling components of the tester, at least one test site located within the external housing and including a pattern source capable of outputting signals to test the DUT, a test site controller capable of controlling the operation of the test site, and a plurality of pin electronics (PEs) channels capable of coupling signals from the pattern source to a plurality of pins on the at least one DUT through a DUT interface, each DUT interface being at least partially coupled about the respective external housing and the plurality of testers being mechanically coupled with one another.

24. A test system according to claim 23, further comprising an automatic material handler to electrically couple a number of DUTs to at least one DUT interface on the plurality of testers, whereby the number of DUTs can be tested simultaneously in parallel on different testers.

25. A test system according to claim 23, wherein the testers are electrically coupled together to enable the testing of DUTs having a number of pins at least greater than the plurality of PE channels on any one tester.

26. A test system according to claim 23, further comprising a single software user interface on the host computer to control all test sites in the plurality of testers.

27. A test system according to claim 23, further comprising a single emergency power off (EPO) switch to enable an operator to simultaneously switch off power to all of the plurality of testers.

28. A test system according to claim 23, wherein each of the plurality of testers have substantially identical chassis.

29. A test system according to claim 23, wherein the plurality of testers have substantially identical external housings.

30. A test system for testing at least one device under test (DUT) comprising a first tester having a first external housing and a second tester having a second external housing distinct from the first external housing and a coupler for mechanically coupling the first and second testers together, each of the first and second testers including at least one test site located within the respective first or second external housing and having a pattern source capable of outputting signals to test the DUT, a test site controller capable of controlling the operation of the test site, and a plurality of pin electronics (PEs) channels capable of coupling signals from the pattern source to a plurality of pins on the at least one DUT through a DUT interface, each DUT interface being at least partially coupled about the respective first or second external housing and at least a portion of side surfaces of the first tester being free of essential connectors that would impede mechanically coupling the first tester side-by-side with the second tester.

31. A test system for testing at least one device under test (DUT) comprising: a first tester having a first external housing and a second tester having a second external housing and a coupler for mechanically coupling the first and second testers together, each of the first and second testers including at least one test site located within the respective first or second external housing and having a pattern source capable of outputting signals to test the DUT, a test site controller capable of controlling the operation of the test site and a plurality of pin electronics (PEs) channels capable of coupling signals from the pattern source to a plurality of pins on the at least one DUT through a DUT interface, each DUT interface being at least partially coupled about the respective first or second external housing and at least a portion of a back surface of the first external housing being free of essential connectors that would impede mechanically coupling the first tester back-to-back with the second tester.

32. A test system for testing at least one device under test (DUT) comprising first, second and third testers having respective first, second and third external housings, and a coupler for mechanically coupling the first and second testers together, each of the first, second and third testers including at least one test site located within the respective first, second or third external housing and having a pattern source capable of outputting signals to test the DUT, a test site controller capable of controlling the operation of the test site, and a plurality of pin electronics (PEs) channels capable of coupling signals from the pattern source to a plurality of pins on the at least one DUT through a DUT interface, each DUT interface being at least partially coupled about the respective first, second or third external housing and at least a portion of a back surface and side surfaces of the first tester being free of essential connectors that would impede mechanically coupling the first tester side-by-side with the second tester and back-to-back with the third tester.

33. A test system comprising a plurality of testers having a respective plurality of external housings and capable of operating as a standalone tester for testing a device under test (DUT) having a pin count not greater than a maximum pin count associated with the respective standalone tester, the plurality of testers being mechanically and electrically coupled with each other such that the test system is capable of testing a DUT having a pin count greater than the maximum pin count associated with any one of the plurality of testers, each of the plurality of testers including a DUT interface and the DUT interfaces of the plurality of testers interfacing with at least one DUT via a DUT board, each such DUT interface being extendable to engage the DUT board positioned thereover.

34. A test system comprising a plurality of testers having a respective plurality of external housings and capable of operating as a standalone tester for testing a device under test (DUT) having a pin count not greater than a maximum pin count associated with the respective standalone tester, the plurality of testers being mechanically and electrically coupled with each other such that the test system is capable of testing a DUT having a pin count greater than the maximum pin count associated with any one of the plurality of testers, each of the plurality of testers including a DUT interface for interfacing with at least one DUT via a DUT board and a docking mechanism configured to pull the DUT board toward a top surface of the tester to engage the DUT board with the respective DUT interface.

35. A test system according to claim 34, wherein the docking mechanism is configured to prevent the DUT board from being pulled toward the top surface of the tester to engage the DUT board with the DUT interface if the DUT board is not properly positioned over the top surface of the tester.

36. A test system for testing at least one device under test (DUT) comprising a first tester having a first external housing and a second tester having a second external housing distinct from the first external housing and a coupler for mechanically coupling the first and second testers together, each of the first and second testers including at least one test site located within the respective first or second external housing and having a pattern source capable of outputting signals to test the DUT, a test site controller capable of controlling the operation of the test site, and a plurality of pin electronics (PEs) channels capable of coupling signals from the pattern source to a plurality of pins on the at least one DUT through a DUT interface, each DUT interface being least partially coupled about the respective first or second external housing and the first and second testers being coupled to a single host computer.

37. A test system for testing at least one device under test (DUT) comprising a first tester having a first external housing and a second tester having a second external housing distinct from the first external housing and a coupler for mechanically coupling the first and second testers together, each of the first and second testers including at least one test site located within the respective first or second external housing and having a pattern source capable of outputting signals to test the DUT, a test site controller capable of controlling the operation of the test site, and a plurality of pin electronics (PEs) channels capable of coupling signals from the pattern source to a plurality of pins on the at least one DUT through a DUT interface, each DUT interface being at least partially coupled to the respective first or second external housing and the first external housing including first vents in a top surface and second vents in a front surface thereof, whereby internal components of the first tester located within the first external housing can be cooled by movement of air through the first and second vents without interference from the second tester when the second tester is mechanically coupled to either a side or a back of the first external housing of the first tester.

38. A test system according to claim 37, wherein the first tester includes a backplane and a number of daughter boards each embodying a test site with the number of daughter boards depending from the backplane in the first external housing, and wherein the backplane includes a number of openings therein to direct air over components on the daughter boards.

39. A test system according to claim 37, wherein the first tester includes a number of daughter boards coupled to edge connectors in the first external housing, each of the number of daughter boards embodying a test site, and wherein air is directed between the edge connectors and over either side of the daughter boards to cool components thereon.

40. A test system for testing at least one device under test (DUT) comprising a first tester having a first external housing and a second tester having a second external housing distinct from the first external housing and a coupler for mechanically coupling the first and second testers together, each of the first and second testers including at least one test site located within the respective first or second external housing and having a pattern source capable of outputting signals to test the DUT, a test site controller capable of controlling the operation of the test site, and a plurality of pin electronics (PEs) channels capable of coupling signals from the pattern source to a plurality of pins on the at least one DUT through a DUT interface, each DUT interface being at least partially coupled to the respective first or second external housing and the coupler being configured to affix the first and second testers to a common holding frame.

* * * * *